US008984320B2

(12) United States Patent
Bringivijayaraghavan (10) Patent No.: US 8,984,320 B2
(45) Date of Patent: Mar. 17, 2015

(54) COMMAND PATHS, APPARATUSES AND METHODS FOR PROVIDING A COMMAND TO A DATA BLOCK (75) Inventor: Venkatraghavan Bringivijayaraghavan, Plano, TX (US)

(73) Assignee: Micron Technology, Inc., Boise, ID (US)

(*) Notice: Subject to any disclaimer, the term of this patent is extended or adjusted under 35 U.S.C. 154(b) by 810 days.

(21) Appl. No.: 13/074,972

(22) Filed: Mar. 29, 2011

(65) Prior Publication Data
US 2012/0254873 A1    Oct. 4, 2012

(51) Int. Cl.
G06F 1/12       (2006.01)
G11C 7/22       (2006.01)
G11C 7/10       (2006.01)

(52) U.S. Cl.
CPC ..................................... G11C 7/222 (2013.01)
USPC ...... 713/401; 713/400; 365/189.05; 365/191; 365/194; 718/102

(58) Field of Classification Search
CPC ........... G11C 7/22; G11C 7/109; G11C 7/222
USPC ............. 713/400–401; 365/189.05, 191, 194; 718/102
See application file for complete search history.

(56) References Cited

U.S. PATENT DOCUMENTS

| 5,004,933 | A  | 4/1991  | Widener |
| 6,111,810 | A  | 8/2000  | Fujita |
| 6,219,384 | B1 | 4/2001  | Kliza et al. |
| 6,260,128 | B1 | 7/2001  | Ohshima et al. |
| 6,275,077 | B1 | 8/2001  | Tobin et al. |
| 6,424,592 | B1 | 7/2002  | Maruyama |
| 6,438,055 | B1 | 8/2002  | Taguchi et al. |
| 6,459,313 | B1 | 10/2002 | Godbee et al. |
| 6,489,823 | B2 | 12/2002 | Iwamoto |
| 6,510,095 | B1 | 1/2003  | Matsuzaki et al. |
| 6,636,110 | B1 | 10/2003 | Ooishi et al. |
| 6,687,185 | B1 | 2/2004  | Keeth et al. |
| 6,710,726 | B2 | 3/2004  | Kim et al. |
| 6,744,285 | B2 | 6/2004  | Mangum et al. |
| 6,781,861 | B2 | 8/2004  | Gomm et al. |
| 6,839,288 | B1 | 1/2005  | Kim et al. |
| 6,861,901 | B2 | 3/2005  | Prexl et al. |
| 6,914,798 | B2 | 7/2005  | Kwon et al. |
| 6,930,955 | B2 | 8/2005  | Johnson et al. |

(Continued)

OTHER PUBLICATIONS

Related U.S. Appl. No. 13/093,640, filed Apr. 25, 2011.

(Continued)

*Primary Examiner* — Brian Misiura
(74) *Attorney, Agent, or Firm* — Dorsey & Whitney LLP (57) ABSTRACT Command paths, apparatuses, and methods for providing a command to a data block are described. In an example command path, a command receiver is configured to receive a command and a command buffer is coupled to the command receiver and configured to receive the command and provide a buffered command. A command block is coupled to the command buffer to receive the buffered command. The command block is configured to provide the buffered command responsive to a clock signal and is further configured to add a delay before to the buffered command, the delay based at least in part on a shift count. A command tree is coupled to the command block to receive the buffered command and configured to distribute the buffered command to a data block.

24 Claims, 9 Drawing Sheets

(56) References Cited

U.S. PATENT DOCUMENTS

| | | | |
|---|---|---|---|
| 6,973,008 B2 | 12/2005 | Krause | |
| 6,980,479 B2 | 12/2005 | Park | 365/233 |
| 6,988,218 B2 | 1/2006 | Drexler | |
| 7,042,799 B2 | 5/2006 | Cho | |
| 7,046,060 B1 | 5/2006 | Minzoni et al. | |
| 7,058,799 B2 | 6/2006 | Johnson | |
| 7,061,941 B1 | 6/2006 | Zheng | |
| 7,065,001 B2 | 6/2006 | Johnson et al. | |
| 7,111,185 B2 | 9/2006 | Gomm et al. | |
| 7,119,591 B1 | 10/2006 | Lin | |
| 7,170,819 B2 | 1/2007 | Szczypinski | |
| 7,187,599 B2 | 3/2007 | Schnell et al. | |
| 7,209,396 B2 | 4/2007 | Schnell | |
| 7,248,512 B2 | 7/2007 | Shin | |
| 7,268,605 B2 | 9/2007 | Fang et al. | |
| 7,269,754 B2 | 9/2007 | Ramaswamy et al. | |
| 7,280,430 B2 | 10/2007 | Lee | |
| 7,336,752 B2 | 2/2008 | Vlasenko et al. | |
| 7,340,632 B2 | 3/2008 | Park | 713/401 |
| 7,375,560 B2 | 5/2008 | Lee et al. | |
| 7,411,852 B2 | 8/2008 | Nishioka et al. | |
| 7,443,216 B2 | 10/2008 | Gomm et al. | |
| 7,451,338 B2 | 11/2008 | Lemos | 713/400 |
| 7,463,534 B2 | 12/2008 | Ku et al. | |
| 7,489,172 B2 | 2/2009 | Kim | |
| 7,509,517 B2 | 3/2009 | Matsumoto et al. | |
| 7,590,013 B2 | 9/2009 | Yu et al. | |
| 7,593,273 B2 | 9/2009 | Chu et al. | |
| 7,609,584 B2 * | 10/2009 | Kim et al. | 365/233.18 |
| 7,616,040 B2 | 11/2009 | Motomura | |
| 7,631,248 B2 | 12/2009 | Zakharchenko et al. | |
| 7,643,334 B1 | 1/2010 | Lee et al. | |
| 7,656,745 B2 | 2/2010 | Kwak | |
| 7,660,187 B2 | 2/2010 | Johnson et al. | 365/233.17 |
| 7,663,946 B2 | 2/2010 | Kim | |
| 7,671,648 B2 | 3/2010 | Kwak | |
| 7,698,589 B2 | 4/2010 | Huang | |
| 7,715,260 B1 | 5/2010 | Kuo et al. | |
| 7,716,510 B2 | 5/2010 | Kwak | |
| 7,751,261 B2 | 7/2010 | Cho | |
| 7,773,435 B2 | 8/2010 | Cho | |
| 7,822,904 B2 | 10/2010 | LaBerge | |
| 7,826,305 B2 | 11/2010 | Fujisawa | |
| 7,826,583 B2 | 11/2010 | Jeong et al. | |
| 7,872,924 B2 | 1/2011 | Ma | |
| 7,885,365 B2 | 2/2011 | Hagleitner et al. | |
| 7,913,103 B2 | 3/2011 | Gold et al. | |
| 7,945,800 B2 | 5/2011 | Gomm et al. | |
| 7,948,817 B2 | 5/2011 | Coteus et al. | |
| 7,969,813 B2 | 6/2011 | Bringivijayaraghavan et al. | |
| 7,983,094 B1 | 7/2011 | Roge et al. | |
| 8,004,884 B2 | 8/2011 | Franceschini et al. | |
| 8,018,791 B2 | 9/2011 | Kwak | |
| 8,030,981 B2 | 10/2011 | Kim | |
| 8,144,529 B2 | 3/2012 | Chuang et al. | |
| 8,321,714 B2 | 11/2012 | Wu et al. | |
| 8,358,546 B2 * | 1/2013 | Kim et al. | 365/194 |
| 8,392,741 B2 | 3/2013 | Kim et al. | |
| 8,509,011 B2 * | 8/2013 | Bringivijayaraghavan | 365/194 |
| 8,788,896 B2 | 7/2014 | Tekumalla | |
| 2001/0015924 A1 | 8/2001 | Arimoto et al. | |
| 2002/0057624 A1 | 5/2002 | Manning | |
| 2003/0117864 A1 | 6/2003 | Hampel et al. | 365/200 |
| 2005/0024107 A1 | 2/2005 | Takai et al. | |
| 2005/0047222 A1 | 3/2005 | Rentschler | |
| 2005/0132043 A1 | 6/2005 | Wang et al. | |
| 2005/0270852 A1 | 12/2005 | Dietrich et al. | |
| 2006/0062341 A1 | 3/2006 | Edmondson et al. | |
| 2006/0155948 A1 | 7/2006 | Ruckerbauer | |
| 2006/0182212 A1 | 8/2006 | Hwang et al. | |
| 2006/0193194 A1 | 8/2006 | Schnell | |
| 2007/0033427 A1 | 2/2007 | Correale, Jr. et al. | |
| 2007/0046346 A1 | 3/2007 | Minzoni | |
| 2007/0088903 A1 | 4/2007 | Choi | |
| 2007/0192651 A1 | 8/2007 | Schoch | |
| 2007/0291558 A1 | 12/2007 | Joo | |
| 2008/0080267 A1 * | 4/2008 | Lee | 365/191 |
| 2008/0080271 A1 | 4/2008 | Kim | |
| 2008/0082707 A1 | 4/2008 | Gupta et al. | |
| 2008/0144423 A1 | 6/2008 | Kwak | |
| 2009/0232250 A1 | 9/2009 | Yamada et al. | |
| 2009/0315600 A1 | 12/2009 | Becker et al. | 327/158 |
| 2010/0001762 A1 | 1/2010 | Kim | 326/93 |
| 2010/0066422 A1 | 3/2010 | Tsai | |
| 2010/0124090 A1 | 5/2010 | Arai | |
| 2010/0124102 A1 | 5/2010 | Lee et al. | |
| 2010/0165769 A1 | 7/2010 | Kuroki | |
| 2010/0165780 A1 | 7/2010 | Bains et al. | |
| 2010/0195429 A1 | 8/2010 | Sonoda | |
| 2010/0199117 A1 | 8/2010 | Kwak | |
| 2010/0232213 A1 | 9/2010 | Hwang et al. | |
| 2010/0254198 A1 | 10/2010 | Bringivijayaraghavan et al. | |
| 2011/0047319 A1 | 2/2011 | Jeon et al. | |
| 2011/0055671 A1 | 3/2011 | Kim et al. | |
| 2011/0228625 A1 | 9/2011 | Bringivijayaraghavan | |
| 2011/0238866 A1 | 9/2011 | Zitlaw | |
| 2011/0238941 A1 | 9/2011 | Xu et al. | |
| 2011/0298512 A1 | 12/2011 | Kwak | |
| 2011/0314324 A1 | 12/2011 | Ozdemir | |
| 2012/0084575 A1 | 4/2012 | Flores et al. | |
| 2012/0124317 A1 | 5/2012 | Mirichigni et al. | |
| 2013/0141994 A1 | 6/2013 | Ito et al. | |
| 2013/0194013 A1 | 8/2013 | Kwak | |
| 2013/0250701 A1 | 9/2013 | Bringivijayaraghavan et al. | |
| 2013/0321052 A1 | 12/2013 | Huber et al. | |
| 2013/0329503 A1 | 12/2013 | Bringivijayaraghavan | |
| 2013/0342254 A1 | 12/2013 | Mazumder et al. | |
| 2014/0010025 A1 | 1/2014 | Bringivijayaraghavan | |
| 2014/0035640 A1 | 2/2014 | Kwak et al. | |
| 2014/0055184 A1 | 2/2014 | Vankayala | |
| 2014/0119141 A1 | 5/2014 | Tamlyn et al. | |
| 2014/0177359 A1 | 6/2014 | Kumar et al. | |
| 2014/0258764 A1 | 9/2014 | Kwak | |

OTHER PUBLICATIONS

Related U.S. Appl. No. 13/364,198, filed Feb. 1, 2012.
Related U.S. Appl. No. 13/486,674, filed Jun. 1, 2012.
Related U.S. Appl. No. 13/531,341, filed Jun. 22, 2012.
Related U.S. Appl. No. 13/543,698, filed Jul. 6, 2012.
Notification of International Search Report and Written Opinion dated May 7, 2012 for International Application No. PCT/US2012/027672, May 7, 2012, 1-9.
"Interfacing DDR SDRAM with Stratix II Devices", Version 3.2, Altera Corp, Sep. 2008.
Lee, "How to Implement DDR SGRAM in Graphic System", Samsung Electric, 1998.
First Office action dated May 20, 2014 received for TW Appln No. 101109756.
Office action dated Sep. 29, 2014 received for TW Appln No. 101109756.

* cited by examiner

COMMAND PATHS, APPARATUSES AND METHODS FOR PROVIDING A COMMAND TO A DATA BLOCK

TECHNICAL FIELD

Embodiments of the invention relate generally to semiconductor memory, and more specifically, in one or more described embodiments, to timing internal clock and command signals for executing memory commands in a high-speed memory clock system.

BACKGROUND OF THE INVENTION

In semiconductor memory, proper operation of the memory is based on the correct timing of various internal command and clock signals. For example, in reading data from the memory, internal clock signals that clock data block circuitry to provide (e.g. output) the read data may need to be provided substantially concurrently with internal read command signals to properly enable the data block circuitry to output the read data. If the timing of the internal read command signal is not such that the data block circuitry is enabled at the time the internal clock signal clocks the data block circuitry to output the read data at an expected time, the read command may be inadvertently ignored or the read data provided by the memory may not be correct (i.e., the data associated with another read command).

Moreover, as known, a "latency" may be programmed to set a time, typically in numbers of clock periods tCK, between receipt of a read command by the memory and when the data is output by the memory. The latency may be programmed by a user of the memory to accommodate clock signals of different frequencies (i.e., different clock periods). Other examples of commands that may require that the correct timing of internal clock signals and the command for proper operation include, for example, write commands and on-die termination enable commands.

Complicating the generating of correctly timed internal clock and command signals is the relatively high frequency of memory clock signals. For example, memory clock signals can exceed 1 GHz. Further complicating the matter is that multi-data rate memories may provide and receive data at a rate higher than the memory clock signal, which may represent the rate at which commands may be executed. As a result, the timing domains of command and clock signals may need to be crossed in order to maintain proper timing. An example of a multi-data rate memory is one that outputs read data at a rate twice that of the clock frequency, such as outputting data synchronized with clock edges of the memory clock signal.

An example conventional approach of timing internal command and clock signals is modeling both the clock path and the command path to have the same propagation delay. This may require, however, that delays and/or counter circuitry run continuously. As a result, power consumption may be higher than desirable. Additionally, the propagation delay of the various internal clock and command paths can often vary due to power, voltage, and temperature conditions. For clock and command paths having relatively long propagation delay or additional delay circuitry, the variations due to operating conditions may negatively affect the timing of the internal signals to such a degree that the memory does not operate properly.

DETAILED DESCRIPTION

Certain details are set forth below to provide a sufficient understanding of embodiments of the invention. However, it will be clear to one skilled in the art that embodiments of the invention may be practiced without these particular details. Moreover, the particular embodiments of the present invention described herein are provided by way of example and should not be used to limit the scope of the invention to these particular embodiments. In other instances, well-known circuits, control signals, timing protocols, and software operations have not been shown in detail in order to avoid unnecessarily obscuring the invention.

Figure 1:
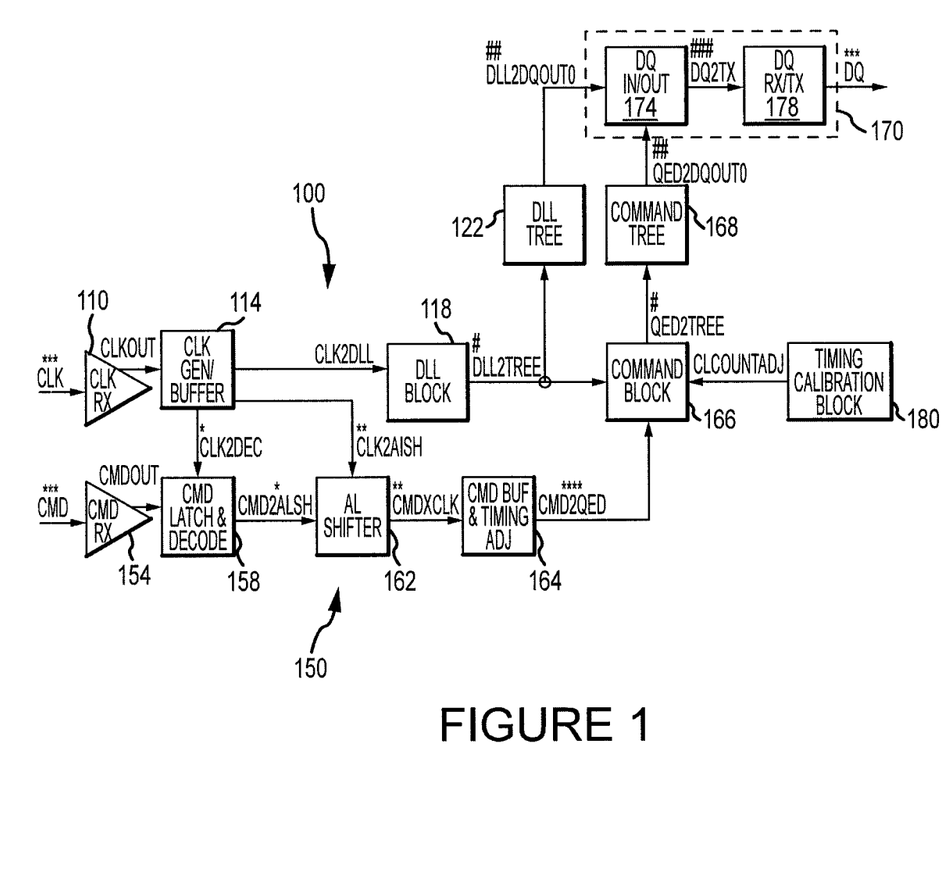
FIG. 1 is a simplified block diagram of clock and command paths according to an embodiment of the invention.

FIG. 1 illustrates clock path 100 and command path 150 according to an embodiment of the invention. The clock path 100 may be configured to provide a distributed clock signal DLL2DQOUT that is based at least in part on the timing of input clock signal CLK, for example, a system clock, to various circuitry. The DLL2DQOUT signal may be used to clock the various circuitry during operation. The clock path 100 includes a clock receiver 110 configured to receive a clock signal CLK and provide an output clock signal CLKOUT to a clock buffer 114. The clock receiver 110 may drive the signal levels of the CLK signal to a full clock signal voltage before providing the resulting CLKOUT signal to the clock buffer 114. The clock buffer 114 may be configured to buffer the CLKOUT signal and provide an output clock signal CLK2DLL to delay lock loop (DLL) 118. The clock buffer 114 may also be configured to provide output clock signals CLK2DEC and CLK2ALSH to the command path 150. As will be explained in more detail below, the CLK2DEC and CLK2ALSH signals may be used during operation of the command path 150. The CLK2DLL, CLK2DEC, and CLK2ALSH signals provided by the clock buffer 114 may be based at least in part on the CLKOUT signal from the clock receiver 110.

The DLL 118 provides an output clock signal DLL2TREE to a DLL tree circuit 122, which is configured to distribute the DLL2TREE signal as distributed clock signals DLL2DQOUT, for example, to a plurality of data input/output circuits 174 of data block 170. The DLL2DQOUT signals may be used to clock the data input/output circuits 174 to input and output data DQ, such as that retrieved (e.g., read data) from a memory array to the data receiver/transmitter 178. A data circuit path delay may be defined to include at least some of the propagation delays due to the DLL tree circuit 122, and the data input/output circuits 174 and the data receiver/transmitter 178. In some embodiments, the data circuits 174 are configured to provide and receive data at a frequency twice the frequency of the DLL2DQOUT signal (i.e., twice the frequency of the CLK signal).

As known, electronic circuitry have inherent propagation delays which may result in signal delays as a signal is received and provided by the circuitry. For example, as the CLK signal propagates through the clock path 100 to be output by the DLL tree 122, the phase of the DLL2DQOUT signals may be different than the CLK signal. This is problematic where the propagation delay of the circuitry is significant enough to cause errors or negatively affect memory performance, for example, where it is desirable for the DQ to be output corresponding to (e.g., coincident with) the CLK signal. The DLL 118, however, may be configured to output the DLL2TREE signal having a delay relative to the CLK signal (received from the clock buffer 114 as the CLK2DLL signal) such that the timing of the DLL2DQOUT clocking the data circuits 174 results in DQ received or provided by the data receiver/transmitter 178 to be substantially in phase with the CLK signal.

The command path 150 may be configured to provide a command CMD, for example, a read command, from an input to various circuitry for use during operation. The command path 150 has a command path delay. That is, the command path 150 takes a finite time, as known, to propagate a command from the input to the circuitry using the command. The signal provided to the various circuitry may be used, for example, to enable operation of the circuitry. The command path 150 of FIG. 1 includes a command receiver 154 that is configured to receive the CMD and provide an output command signal CMDOUT to a command latch and decoder 158. The command latch and decoder 158 latches, decodes, and outputs the CMDOUT signal responsive to the CLK2DEC signal from the clock buffer 114 of the clock path 100. That is, the command latch and decoder 158 outputs decoded command signal CMD2ALSH to an additive latency (AL) shifter 162 responsive to the CLK2DEC signal. The AL shifter 162 is configured to shift the CMD2ALSH signal through it responsive to the CLK2ALSH signal from the clock buffer 114 of the clock path 100. The shifting adds clock cycles tCK of the CLK signal (by virtue of the CLK2ALSH signal) to provide additive latency to the propagation of the CMD signal through the command path 100. As known, AL may be added to accommodate the timing of internal operations of the memory and may be programmed or set by a user or manufacture, for example, by an additive latency value (typically in terms of the number of tCKs). The AL shifter 162 may provide a crossing point between a clock timing domain of the CLK signal and a command timing domain of the CMD signal.

After the CMD2ALSH signal is shifted to provide the additive latency, it is output by the AL shifter 162 as output command signal CMDXCLK to command buffer and timing adjustment block 164 which is configured to provide additional delay to the propagation of the CMD signal through the command path 150. Following the delay provided by the timing adjustment block 164, the CMDXCLK signal is output as the CMD2QED signal to command block 166. The command block 166 provides the CMD2QED signal as a QED2TREE signal to a command tree 168 responsive to the DLL2TREE signal from the DLL block 118 from the clock path 100.

As will be described in more detail below, the timing adjustment block 164 may provide delay, for example, to align command signals to provide timing margin and to accommodate changes in the delay through the clock path 100, for example, changes resulting from changes in the delay provided by the DLL block 118 in order to maintain synchronicity of the CLK and DLL2DQOUT signals. In some embodiments, the delay added by the timing adjustment block 164 may be used to align a leading clock edge of CMD2QED signal with a falling clock edge of the DLL2TREE signal, which may improve timing margin for receipt of the CMD2QED signal by the command block responsive to the DLL2TREE signal. For example, where the CMD2QED signal has a signal width of approximately one tCK (i.e., one period of the CLK signal), a rising clock edge of the DLL2TREE signal will be substantially aligned with the center of the CMD2QED signal thereby providing a timing margin of approximately one-half tCK to receive the CMD2QED signal. In some embodiments, timing adjustment circuit 164 may perform a delay determination in response to changes to the timing of the signals in the clock path 100, for example, responsive to changes to the timing made by the DLL block 118. The DLL block 118 may make changes to the timing of the DLL2TREE signal to maintain the synchronization between the CLK and the output of data DQ.

As will also be described in greater detail below, the command block 166 may output the QED2TREE signal following a delay that is based at least in part on a shift count CLCOUNTADJ provided by a timing calibration block 180. For example, in some embodiments, the command block 166 provides a delay based at least in part on a difference between a CAS latency (e.g., programmed by a user) and a path delay measured in a number of tCKs by the timing calibration block 180. The path delay may include delays attributed to various circuits in the clock path 100 and command path 150, as will be described in more detail below.

With further reference to FIG. 1, the command tree 168 is configured to distribute the QED2TREE signal as QED2DQOUT signals to a plurality of data circuits 174 of data block 170. The QED2TREE signals may, for example, be used to control operation of the data circuits 174 such that unless an active QED2DQOUT signal is provided to a data circuit 174 at a time the DLL2DQOUT signal clocks it, data will not be output by the data circuit 174.

In the embodiment of FIG. 1, a power savings benefit may be provided because there is not continuously running upstream and downstream counters. Instead, there is a shifter that runs on a need basis, which as a result, may reduce power consumption.

For convenience, the signals previously discussed that have common phases are identified by common phase symbols in FIG. 1. For example, the CLK, CMD, and DQ signals are generally "in phase," as represented by having the common phase symbol of "***". In another example, DLL2TREE and QED2TREE signals are also generally in phase, as represented by the common phase symbol "#".

Figure 2:
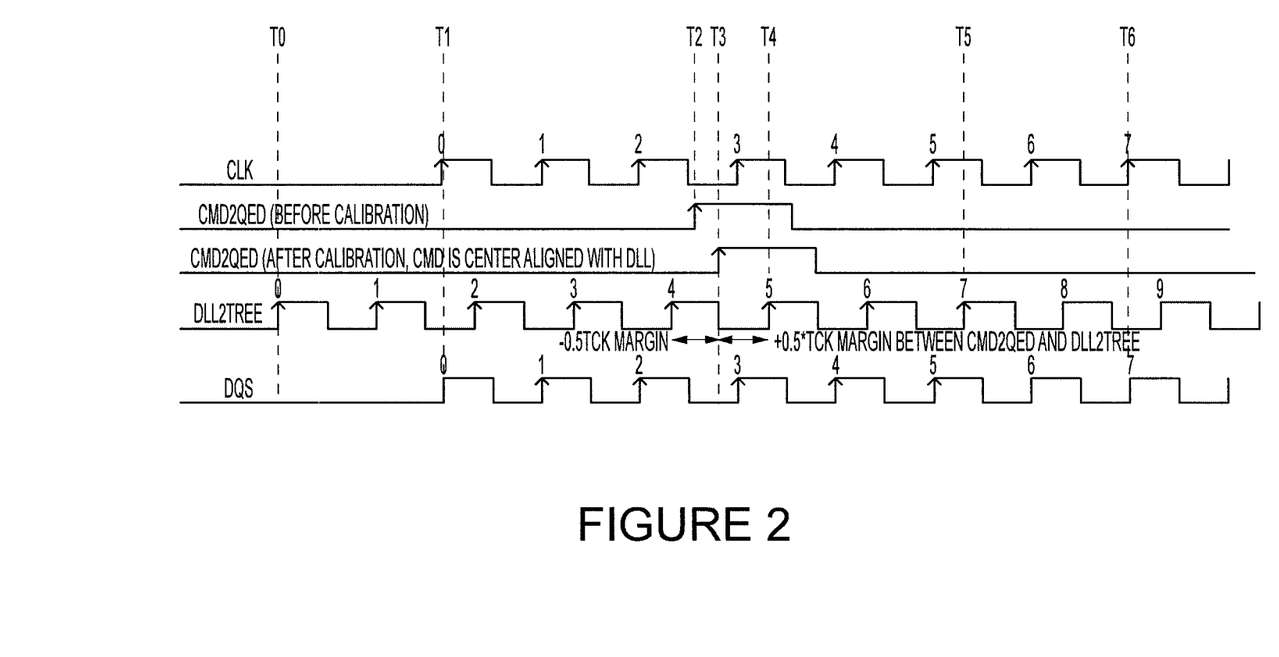
FIG. 2 is a timing diagram of various signals during operation of the clock and command paths of FIG. 1.

Operation of the clock path 100 and command path 150 (FIG. 1) according to an embodiment of the invention will be described with reference to the timing diagram of FIG. 2. FIG. 2 illustrates a timing diagram of various signals during the operation of the clock and command paths 100, 150 of FIG. 1. The example operation will be described with reference to a read command. Additionally, for the purpose of the example operation, it is assumed that the CAS latency is equal to seven tCK, that is, data will expected to be output seven tCK following the input, for example, of a read command.

At time T0, the DLL2TREE signal has a rising clock edge that precedes time T1 by a time equal to a propagation delay through the DLL tree 122, and the data circuits 174 and data receiver/transmitter 178 of the data block 170. As will be understood, the time between T0 and T1 is approximately equal to a path delay through DLL tree 122, data circuits 174 and data receiver/transmitter 178. As also previously discussed, the DLL block 118 may be used to adjust the timing of the DLL2TREE signal relative to the CLK signal so that rising clock edges of the DLL2TREE signal provided to DLL tree 122 will propagate to the data circuits 174 to clock data out of the data block 170 coincident with a rising clock edge of the CLK signal.

At time T1, a read command (not shown) is provided to the command receiver 154 as the CMD substantially coincident with a rising clock edge of the CLK signal, that is, a leading clock edge of the command is substantially coincident with the rising clock edge of the CLK signal. Time T2 represents a time after the input of the CMD at which the CMD propagates through the command latch and decoder 158, the AL shifter 162, and the command buffer and timing adjustment block 164 to be output as the CMD2QED signal to the command block 166, but without any additional delay provided by the command buffer and timing adjustment block 164. Time T3 represents a propagation delay through the command latch and decoder 158, the AL shifter 162, and the command buffer and timing adjustment block 164, but with additional delay added by the command buffer and timing adjustment block 164. As will be understood, the time between T1 and T3 is approximately equal to a path delay from the command receiver 154 through the command buffer and timing adjustment block 164.

As previously discussed, additional delay may be added by the command buffer and timing adjustment block 164 to align the CMD2QED signal with a falling clock edge of the DLL2TREE signal so that the CMD2QED signal (assuming one tCK wide) is substantially center aligned with a rising clock edge of the DLL2TREE signal. The substantial center alignment of the CMD2QED signal is illustrated by the rising clock edge of the DLL2TREE signal at time T4. The difference between times T2 and T3 represents the delay added by the command buffer and timing adjustment block 164 before outputting the CMD2QED signals to the command block 166.

As also previously discussed, the command block 166 may further add delay (e.g., in number of tCKs) to the CMD2QED signals before being output to the command tree 168 responsive to the DLL2TREE signal. The addition delay may be based at least in part on the CLCOUNTADJ shift count from the timing calibration block 180. In the example operation of the timing diagram of FIG. 2, the CLCOUNTADJ shift count is assumed to be two tCKs. That is, the command block 166 waits two tCKs after the time the CMD2QED signal is latched (i.e., time T4) before outputting the CMD2QED signal as the QED2TREE signal to the DLL2TREE, as illustrated in FIG. 2 by the two tCKs between time T4 and time T5. At time T5, the rising clock edge of the DLL2TREE coincides with the QED2TREE signal (not shown) as it is output to the command tree 168. After a propagation delay through the command tree 168, the QED2TREE signal is provided as the QED2DQOUT signal to the data circuits 174 to enable the output of data responsive to the DLL2DQOUT signal (i.e., the DLL2TREE signal distributed by the DLL tree 122). The data, after the propagation delay of the data receiver/transmitter 178, is output coincident with the CLK signal, as illustrated at time T6 by the DQ signal and the CLK signal being substantially aligned (i.e., in phase). The time between T5 and T6 is substantially equal to the time between T0 and T1, both of which represent a propagation delay through the DLL tree 122 (and command tree 168), and through the data circuits 174 and data receiver/transmitter 178 of the data block 170.

It will be appreciated from the example operation that the rising clock edge of the DLL2TREE signal at time T5 is used to clock the command block 166 to output the QED2TREE signal, and after being distributed through the DLL tree 122, to further clock the data circuits 174. The timing of the DLL2TREE signal is such that upon arrival of the QED2DQOUT signal at the data circuits 174 data is output to the data receiver/transmitter 178, to in turn be output coincident with the seventh rising clock edge following the rising clock edge coincident with the input of the CMD signal to the command receiver 154 (i.e., CAS latency of seven tCKs).

Although the previous example was described with specific reference to a read command, embodiments of the invention may be applied to other types of commands as well. For example, an on-die termination (ODT) command which is used to activate ODT circuitry when data is written to memory. Other types of commands may be used as well.

Figure 3:
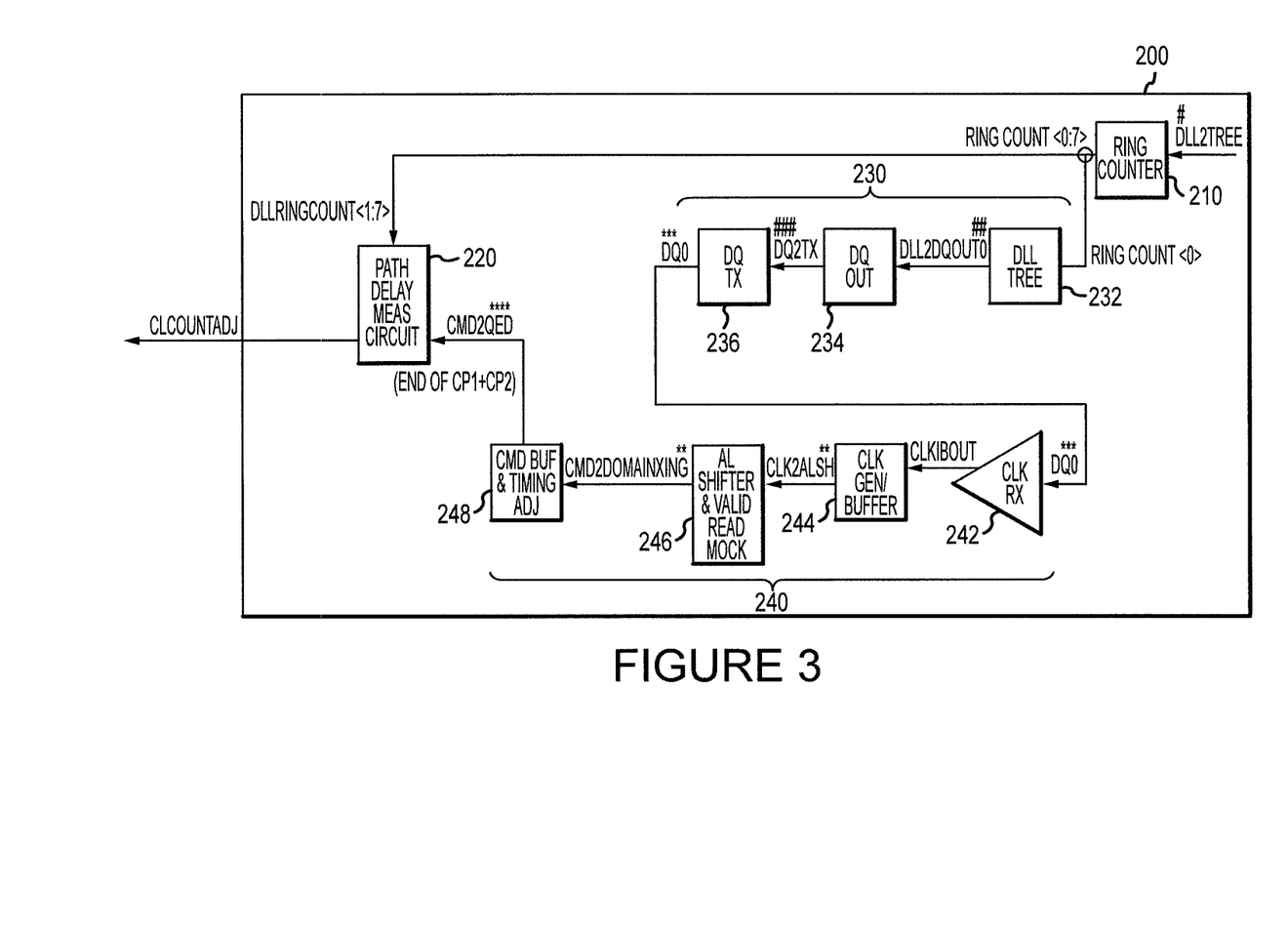
FIG. 3 is a simplified block diagram of a timing calibration block according to an embodiment of the invention.

FIG. 3 illustrates a timing calibration block 200 according to an embodiment of the invention. In some embodiments, the timing calibration block 200 may be used for the timing calibration block 180 of FIG. 1. The timing calibration block 200 provides a CLCOUNTADJ shift count of the number of tCKs a command block, for example, command block 166, should delay CMD2QED signals before being provided to the command tree 168 responsive to the DLL2TREE signal.

The CLCOUNTADJ shift count is based at least in part on the number of tCKs of path delay of various circuits in the clock path 100 and command path 150. For example, in the embodiment of the timing calibration block 200 of FIG. 3, a CLCOUNTADJ shift count is equal to the difference between a CAS latency value and the number of tCKs of path delay attributable to (1) the clock receiver 110 through the command buffer and timing adjustment block 164 and (2) the DLL tree 122 through the data receiver/transmitter 178. The blocks in the timing calibration block in the embodiment of FIG. 3 are included because the sum propagation delay through the blocks represents a minimum asynchronous path delay of the command signal CMD from input through to the data circuits 174 (i.e., path delay (1) from above), and the output of data (in response to the CMD signal) through the data receiver/transmitter 178 (i.e., path delay (2) from above).

The timing calibration block 200 includes a ring counter 210 that is configured to receive the DLL2TREE clock signal output by the DLL 118 and output a ring count RINGCOUNT. The RINGCOUNT is split so that at least some of the bits (i.e., binary digits) are provided to a path delay measurement circuit 220 and at least some one of the remaining bits are provided through a model delay path 230, 240. The model delay path 230 models at least a portion of a data circuit path delay, and in the embodiment of FIG. 3, includes DLL tree model delay 232, data circuit model delay 234 and data receiver/transmitter model delay 236 to model the propagation delay attributable to the DLL tree 122 though the data receiver/transmitter 178. The model delay path 240 includes clock receiver model delay 242, clock buffer model delay 244, AL shifter model delay 246, and command buffer and timing adjustment block model delay 248 to model at least a portion of a command path delay of the command path 150. The model delay path 240 models the path delay for a CMD input to the command receiver 154 through to the command buffer and timing adjustment block 164. The output from the model delay path 240 is provided to the path delay measurement circuit 220, which is configured to determine (e.g., calculate) the CLCOUNTADJ shift count that represents a difference between a CAS latency value and the number of tCKs of path delay through the model delay paths 230, 240 (which model the path delay through the clock and command paths 100, 150).

Although the timing calibration block 200 of FIG. 3 illustrates particular blocks of model delays, in other embodiments of a timing calibration block may include greater or fewer model delays. For example, in some embodiments, a timing calibration block may include a model delay to model propagation delay of a command block of a command path. In some embodiments of a timing calibration block, some of the model delays described with reference to FIG. 3 may not be included. In some embodiments, a model delay included in a timing calibration block may have a different delay than the corresponding block of the clock or command paths which it is modeling. For example, the command buffer and timing adjustment block model delay 248 may have a longer delay than the command buffer and timing adjustment block 164. In this manner, the propagation delay of another block of the clock or command paths, such as the propagation delay of the command block 166 which does not have a corresponding model delay in the timing calibration block 200, may be considered in the calculation by the timing calibration block.

Figure 4:
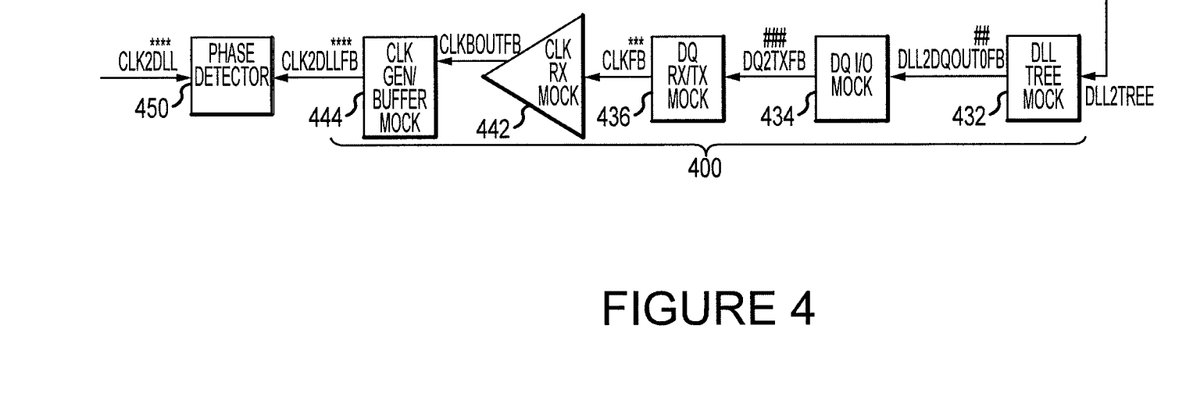
FIG. 4 is a simplified block diagram of a feedback path for a delay-lock loop according to an embodiment of the invention.

In some embodiments, circuitry of another circuit block may be used as model delays for a timing calibration block. For example, the DLL block 118 may include various circuitry that may be used to model propagation delay of blocks of the clock or command paths. The feedback path of the DLL block 118 may include blocks that can be used to model delays in the model delay path 230, 240. For example, a feedback path 400 for a DLL according to an embodiment of the invention is illustrated in FIG. 4. The feedback path 400 includes DLL tree model delay 432, data input/output circuit model delay 434 and data receiver/transmitter model delay 436. The feedback path 300 further includes clock receiver model delay 442 and clock buffer model delay 444. The output of the feedback path 400 is provided to a phase detector 450. The phase detector 450 may be included in a DLL block, for example, DLL 118 of FIG. 1. Some or all of the model delays of the feedback path 400 may be used by a timing calibration block, such as the timing calibration block 200 of FIG. 3. For example, instead of the timing calibration block 200 having dedicated DLL tree model delay 232, data circuit model delay 234 and data receiver/transmitter model delay 236, the model delays 432-444 of the feedback path 400 may be used instead. Other common models delays may be used as well instead of having a separate and dedicated model delay in the timing calibration block 200.

Figure 5:
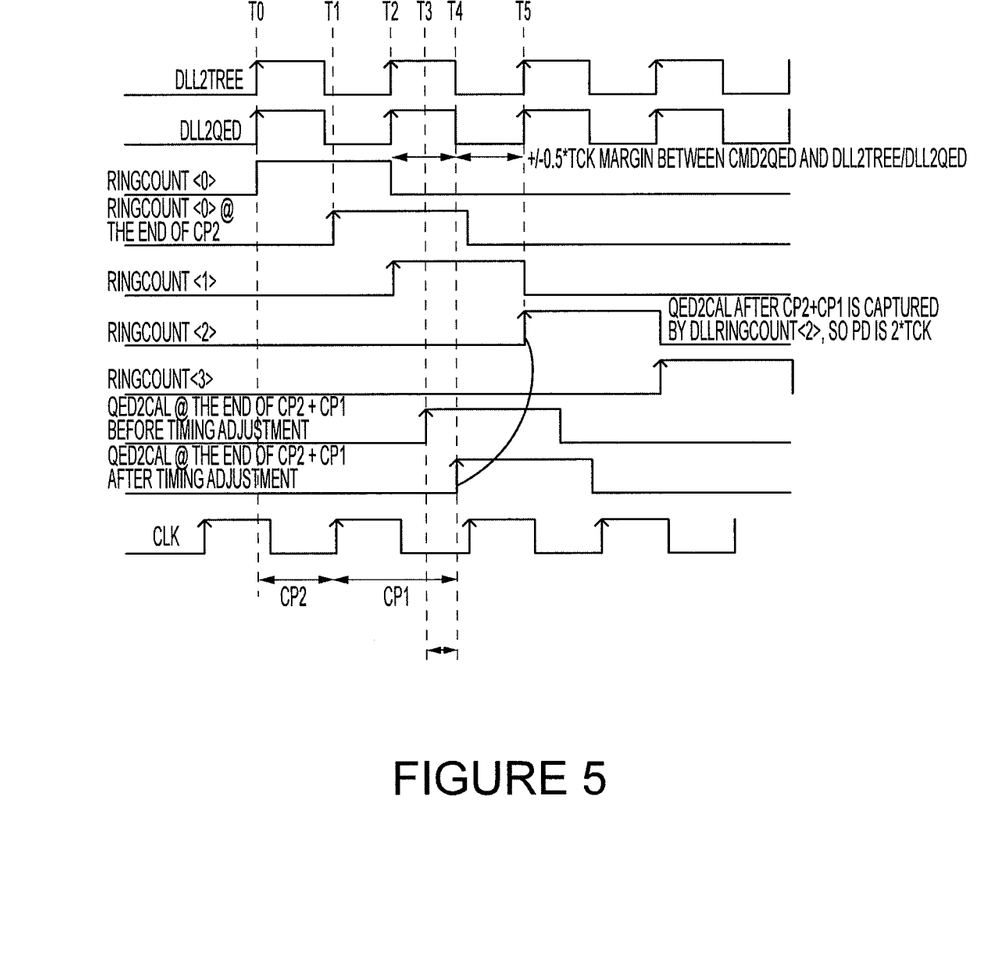
FIG. 5 is a timing diagram of various signals during operation of the timing calibration block of FIG. 3.

FIG. 5 illustrates a timing diagram of various signals during operation of the timing calibration block 200 according to an embodiment of the invention. At time T0, the ring counter 210 begins generating the RINGCOUNT responsive to a rising clock edge of the DLL2TREE signal, as illustrated in FIG. 5 by the leading clock edge of RINGCOUNT<0>. The ring counter 210 is configured to provide (e.g., generate, output, etc.) a sequence of RINGCOUNT signals where each succeeding RINGCOUNT signal has a rising clock edge corresponding to a falling clock edge of the previous RING-COUNT signal. For example, as illustrated in FIG. 5, at time T2 the RINGCOUNT<1> signal has a rising clock edge that corresponds to a falling clock edge of RINGCOUNT<0> and at time T5 the RINGCOUNT<2> signal has a rising clock edge that corresponds to a falling clock edge of RING-COUNT<1>. To begin the sequence of the RINGCOUNT signals again, the RINGCOUNT<0> signal will have a next rising clock edge corresponding to (e.g., coincident with) a falling clock edge of the last RINGCOUNT signal, and each succeeding RINGCOUNT signal will transition as previously described.

With reference to FIG. 5, at time T1, the rising clock edge of RINGCOUNT<0> signal has propagated through the model delay path 230 (representing the propagation delay through data circuitry) and is output to the model delay path 240. At time T3, the rising clock edge of the RING-COUNT<0> signal is output from the model delay path 240 as a QED2CAL signal to the path delay measurement circuit 220 so that the CLCOUNTADJ shift count may be calculated. The additional delay from time T1 to time T3 is due to the delay of model delays 242-248, and represents a minimum propagation delay of a CMD signal from input to the command receiver 154 to output as the CMD2QED signal to the command block 166.

The total delay of the RINGCOUNT<0> signal from time T0 to T3 represents the minimum propagation delay (i.e., without any additional delay added by the command buffer and timing adjustment block model delay 248) through the model delay paths 230, 240. That is, the delay of RING-COUNT<0> through the model delay paths 230, 240, as represented by the difference in time between times T0 and T3, models the delay from, for example, the input of the CMD signal to the command receiver 154 to when data is output from the data receiver/transmitter 178, but without any additional delay added by the command buffer and timing adjustment block 164 of FIG. 1.

As will be described in more detail below, additional delay through the model delay paths 230, 240 may be added by the command buffer and timing adjustment block model delay 248. The delay added by block 248 mirrors additive delay added by the command buffer and timing adjustment block 164 of the command path 150 (FIG. 1). The CMD2QED signal (i.e., RINGCOUNT<0> plus delay of the model delay paths 230, 240) with additive delay added by the command buffer and timing adjustment block model delay 248 is shown in FIG. 5 as well. The additionally delayed CMD2QED signal is illustrated with a rising clock edge at time T4, which corresponds with a falling clock edge of the DLL2TREE signal. The delay between times T3 and T4 represents the additional delay provided by the command buffer and timing adjustment block model delay 248.

In determining the CLCOUNTADJ shift count, the path delay measurement circuit 220 uses RINGCOUNT<1:$n$> signals to determine the number of tCKs of delay through the model delay paths 230, 240. The number of tCKs of path delay may be a next higher whole number for any fractional tCK of delay through the model delay paths 230, 240. For example, as shown in FIG. 5, the delay through the model delay paths 230, 240 (with the additive delay from the command buffer and timing adjustment block model delay 248) is greater than one tCK (i.e., represented by a rising clock edge of the DLL2TREE signal at time T2) but less than two tCKs (i.e., represented by a rising clock edge of the DLL2TREE signal at time T5). As a result, the path delay measurement circuit 220 uses a path delay of two tCKs in calculating the CLCOUNTADJ shift count.

Figure 6:
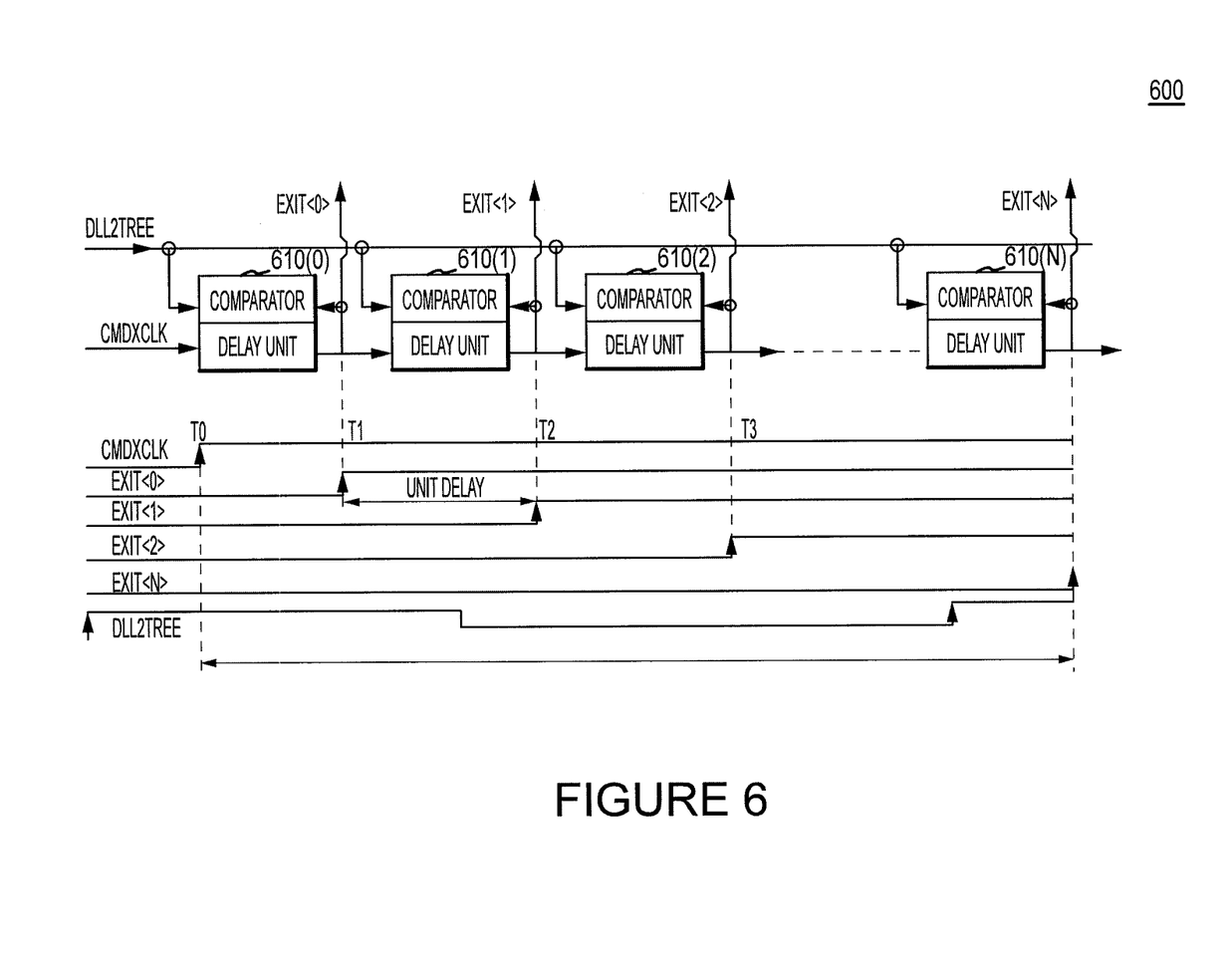
FIG. 6 is a simplified block diagram of a timing adjustment block according to an embodiment of the invention.

FIG. 6 illustrates a timing adjustment block 600 according to an embodiment of the invention, and a timing diagram of various signals during operation of the same. The timing adjustment block 600 may be included in the command buffer and timing adjustment block 164 (FIG. 1). The timing adjustment block 600 is configured to determine an amount of additive delay to add to a path delay of the command path 150, for example, to align a leading clock edge of the CMD2QED signal with a clock edge of the DLL2TREE signal. As previously discussed, the additive delay provided by the timing adjustment block 600 (i.e., command buffer and timing adjustment block 164) may be mirrored by a command buffer and timing adjustment block model delay in a timing calibration block 180, for example, command buffer and timing adjustment block model delay 248 of timing calibration block 200 of FIG. 3.

The timing adjustment block 600 includes a plurality of unit delays and comparators 610(0)-610(n) that may be used to selectively add delay to the command path 150. For example, in the embodiment illustrated in FIG. 6, the additive delay is added to the CMDXCLK signal output by the AL shifter 162 (FIG. 1) of the command path 150 in units of unit delay. The length of delay of the unit delays are typically one tCK or less (i.e., one clock period of the CLK signal) so that sufficient delay resolution is provided by the incremental delay added by a unit delay. In some embodiments, the number of unit delays and comparators 610(0)-610(n) is based at least in part on providing a total delay that is approximately equal to the slowest tCK at a fastest operating condition for the memory in which the timing and adjustment block 600 is included. In a particular example, the maximum delay of the timing adjustment block 600 is 2.5 ns, and includes 12 unit delays and comparators 610, each unit delay 225 ps.

The determination (e.g., selection) of the number of unit delays to add to the path delay is made at least in part through the use of the comparators of the unit delays and comparators 610(0)-610(n). The comparators are configured to compare the DLL2TREE signal and the delayed CMDXCLK signal output by the respective unit delay. For example, in some embodiments of the invention, the comparator that detects a transition of the DLL2TREE signal (e.g., a falling clock edge) is the comparator of the unit delay and comparators 610 that is selected as the last unit delay added by the command buffer and timing adjustment block 164 to the path delay of the command path 150.

An example of the operation of the timing and adjustment block 600 will be described with reference to the timing diagram of FIG. 6. The timing diagram of FIG. 6 illustrates a leading clock edge (i.e., a rising clock edge) of the CMDXCLK signal at time T0 input to a first unit delay and comparator 610(0). The delayed CMDXCLK signal output by the unit delay and comparator 610(0) is illustrated by the delayed rising clock edge at time T1 output by the unit delay and comparator 610(1). The further delayed CMDXCLK signal is illustrated as well, and has a rising clock edge output by the unit delay and comparator 610(2) at time T3. As illustrated in example of FIG. 6, the DLL2TREE signal, which is provided to the unit delays and comparators 610(0)-610(n), has a falling clock edge that is detected by the unit delay and comparator 610(1). As a result, the unit delay and comparator 610(1) represents the last unit delay to be added to the CMDXCLK signal (i.e., add two unit delays) by the timing adjustment block 600 before being output by the command buffer and timing adjustment block 164 to the command block as the CMD2QED signal.

Figure 7:
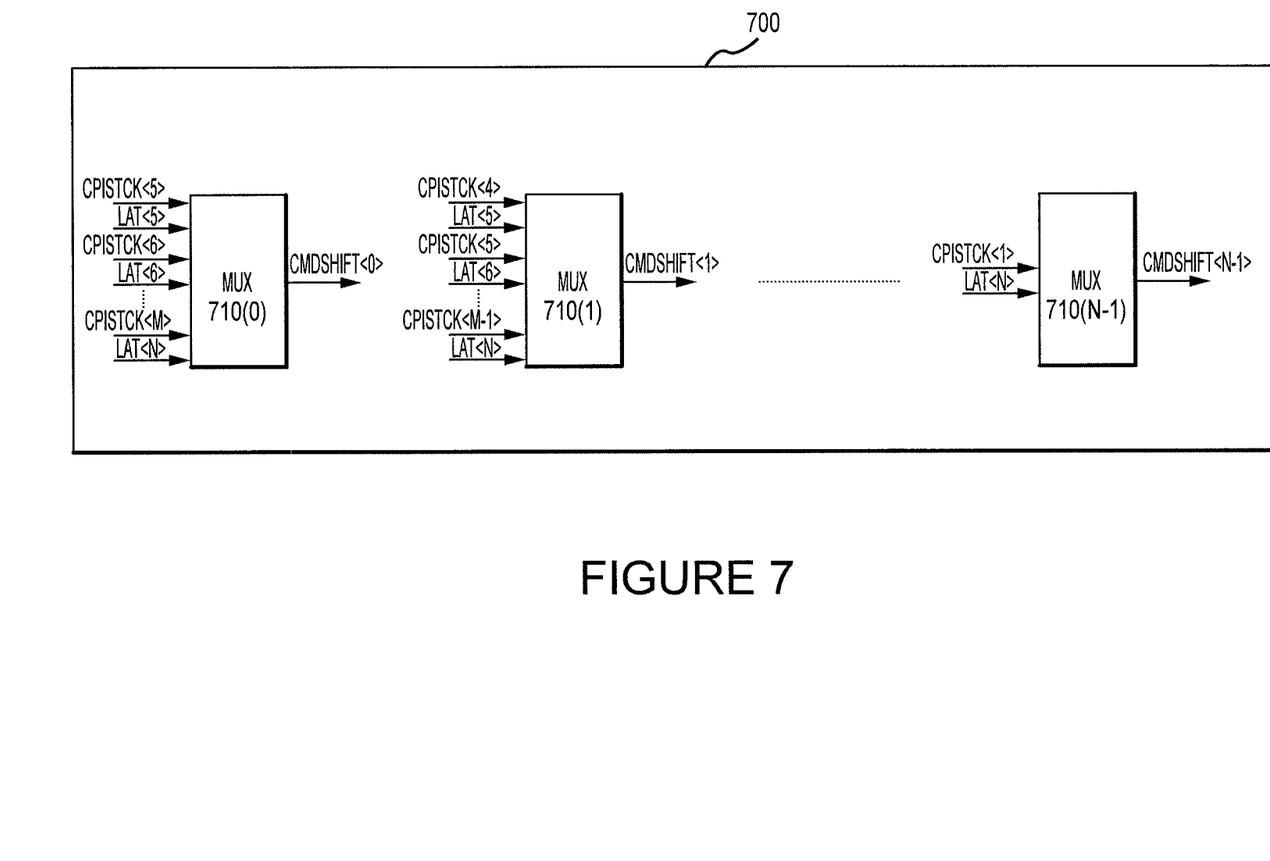
FIG. 7 is a simplified block diagram of a shift adjustment block according to an embodiment of the invention.

FIG. 7 illustrates logic 700 included in a path delay measurement circuit according to an embodiment of the invention. The logic 700 may be, for example, included in the path delay measurement circuit 220 (FIG. 3). The logic 700 includes a plurality of logic blocks 710(0)-710(n−1). Each of the logic blocks 710 receive signals LAT<n> indicative of the CAS latency value "n" for the memory, as well as signals CPIstCK<m> indicative of the number "m" of tCKs of delay through, for example, model delay paths 230, 240. A shift count CMDSHIFT<n-m> based at least in part on the LAT<n> and CPIstCK<m> signals is determined by the logic blocks 710. The CMDSHIFT<n-m> shift count is provided to the command block 166 as the CLCOUNTADJ shift count to be used in setting the number (n-m) of tCKs the CMD2QED signal is delayed before being output to the command tree 168 responsive to the DLL2TREE signal.

In operation, in the embodiment of FIG. 7 each of the logic blocks 710 compares pairs of LAT<n> and CPIstCK<m> signals to determine if a true condition exits. The logic block 710 that determines a true condition of one of its LAT<n>-CPIstCK<m> pairs outputs its respective CMDSHIFT<n-m> shift count. For example, the logic block 710(0) receives LAT<n>-CPIstCK<m> pairs of LAT<5>-CPIstCK<5>, LAT<6>-CPIstCK<6>, . . . LAT<n>-CPIstCK<m>. The logic block 710(0) will output a CMDSHIFT<0> signal indicating a CLCOUNTADJ of zero tCKs (i.e., the CMD2QED signals are not shifted by any tCKs before being output) when any of the LAT<n>-CPIstCK<m> signals it receives is true, that is, if the latency value is 5 and the delay through the model delay paths is 5 tCKs; if the latency value is 6 and the delay through the model delay paths is 6 tCKs; and if the latency value is n and the delay through the model delay paths is m tCKs, where n=m. The LAT<n>-CPIstCK<m> signal pairs provided to the logic block 710(1) are different combinations where (m-n)=1. Although not expressly illustrated in FIG. 7, additional logic blocks 710 are included for different combinations of (m-n), for example, (m-n)=2, (m-n)=3, until (m-n)=(n-1). As a result, the logic blocks 710 of the logic 700 may provide CMDSHIFT signals over a range of zero through (m-n) tCKs to set the command block 166 to add delay between zero tCKs through (m-n) tCKs to the CMD2QED signals.

Figure 8:
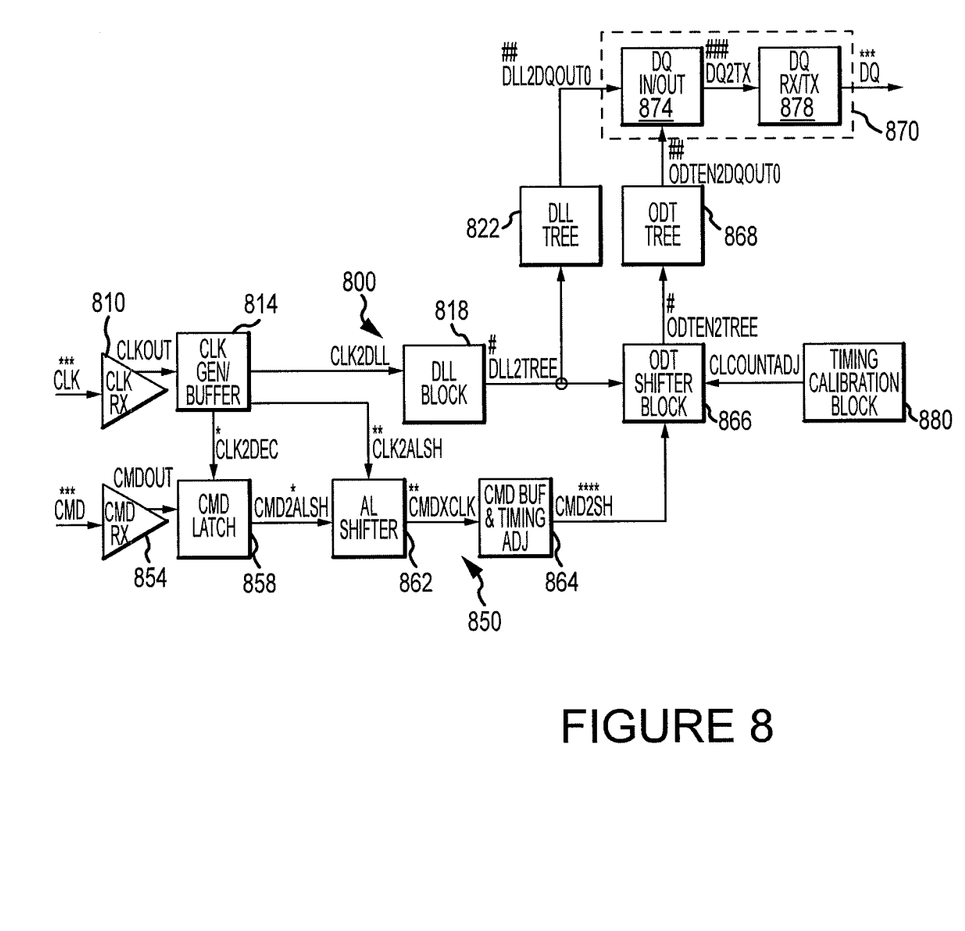
FIG. 8 is a simplified block diagram of clock and ODT command paths according to an embodiment of the invention.

FIG. 8 illustrates a clock path 800 and a command path 850 according to an embodiment of the invention. A data block 870 including a plurality of data circuits 874 and a data receiver/transmitter 878 is coupled to the clock path 800 and the command path 850. A timing calibration block 880 is coupled to the command path 850 and provides a shift count CLCOUNTADJ to the command path 850. The clock path 800, data block 870, and the timing calibration block 880 may be the same as the clock path 100, the data block 170, and the timing calibration block 180 of FIG. 1. The command path 850 is similar to the command path 150, however, as shown in FIG. 8, the command path 850 is for an on-die termination (ODT) command. As known an ODT command is used to enable on-die termination circuits included in the data block 870 for impedance matching, for example, to reduce signal reflection and interference of data signals on external signal lines coupled to the data block 870. The ODT command should be provided to enable the termination circuits at an appropriate time, for example, after expiration of a CAS write latency and at the same time write data is received by the data block 870.

The command path 850 may be configured to provide an ODT command CMD, from an input to the data block 870. The command path 850 includes a command receiver 854 that is configured to receive the CMD and provide an output command signal CMDOUT to a command latch 858. The command latch 858 latches the CMDOUT signal and outputs it as an CMD2ALSH signal to an additive latency (AL) shifter 862 responsive to the CLK2DEC signal from the clock buffer 814 of the clock path 800. The AL shifter 862 is configured to shift the CLK2ALSH signal through it responsive the CLK2ALSH signal from the clock buffer 814 of the clock path 800. After the CMD2ALSH signal is shifted to provide the additive latency, it is output by the AL shifter 862 as output command signal CMDXCLK to command buffer and timing adjustment block 864 which is configured to provide additional delay to the propagation of the CMD signal through the command path 850. Following the delay provided by the timing adjustment block 864, the CMDXCLK signal is output as a CMD2QSH signal to ODT command block 866. The ODT command block 866 provides the CMD2SH signal as a ODTEN2TREE signal to a ODT tree 868 responsive to the DLL2TREE signal from the DLL block 818 from the clock path 800.

The ODT command block 866 may output the ODTEN2TREE signal following a delay that is based at least in part on a shift count CLCOUNTADJ provided by timing calibration block 880. For example, in some embodiments, the ODT command block 866 provides a delay based at least in part on a difference between a CAS write latency (e.g., programmed by a user) and a path delay measured in a number of tCKs by the timing calibration block 880. The ODT tree 868 is configured to distribute the ODTEN2TREE signal as ODTEN22DQOUT signals to a plurality of data input/output circuits 874 of data block 870. The ODTEN2DQOUT signals may, for example, be used to enable ODT circuits of the data input/output circuits 874 such that the ODT circuits are enabled at the appropriate time, for example, to match impedance. As appreciate by those ordinarily skilled in the art, operation of the command path 850 may be similar to the operation of the command path 850, as previously described.

Figure 9:
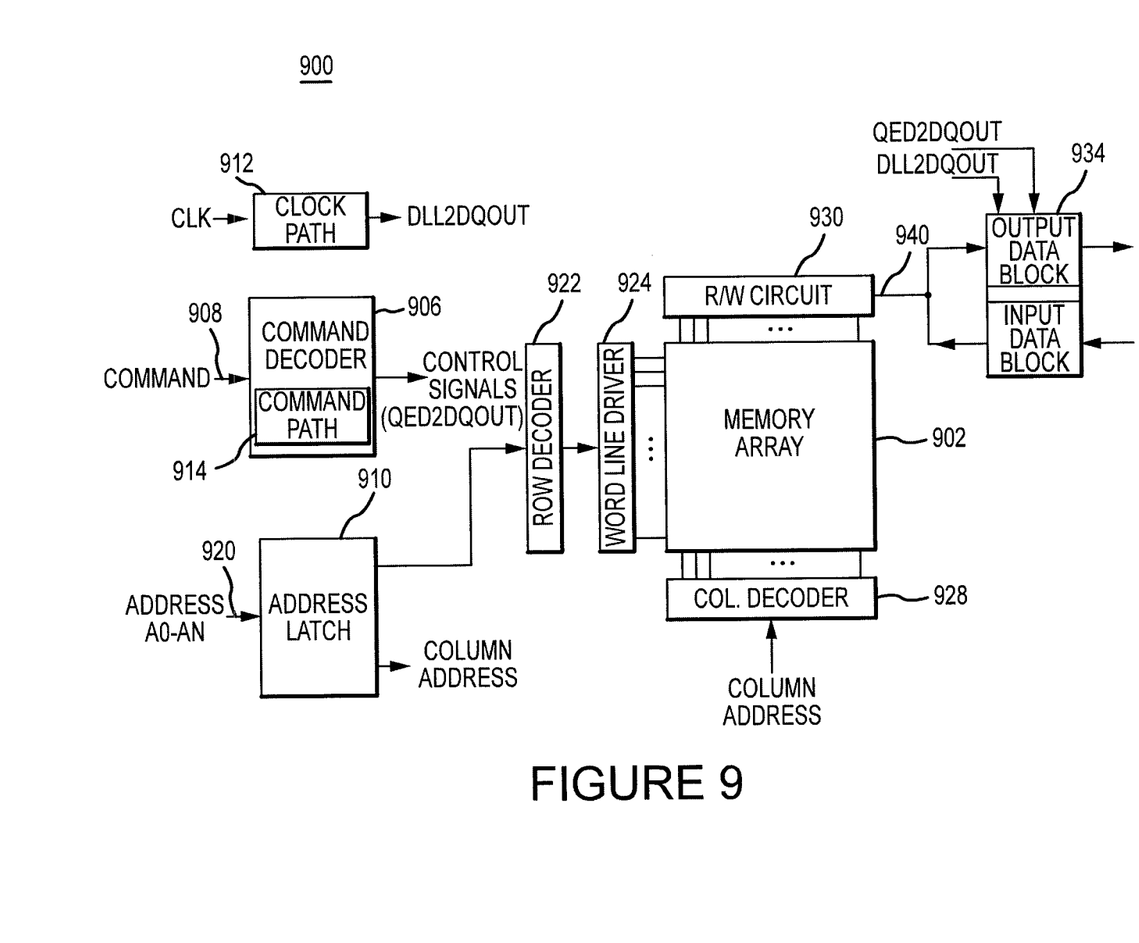
FIG. 9 is a simplified block diagram of a memory including clock and command paths according to an embodiment of the invention.

FIG. 9 illustrates a portion of a memory 900 according to an embodiment of the present invention. The memory 900 includes an array 902 of memory cells, which may be, for example, DRAM memory cells, SRAM memory cells, flash memory cells, or some other types of memory cells. The memory 900 includes a command decoder 906 that receives memory commands through a command bus 908 and provides (e.g. generates) corresponding control signals within the memory 900 to carry out various memory operations. Row and column address signals are provided (e.g., applied) to the memory 900 through an address bus 920 and provided to an address latch 910. The address latch then outputs a separate column address and a separate row address.

The row and column addresses are provided by the address latch 910 to a row address decoder 922 and a column address decoder 928, respectively. The column address decoder 928 selects bit lines extending through the array 902 corresponding to respective column addresses. The row address decoder 922 is connected to word line driver 924 that activates respective rows of memory cells in the array 902 corresponding to received row addresses. The selected data line (e.g., a bit line or bit lines) corresponding to a received column address are coupled to a read/write circuitry 930 to provide read data to an input/output data block 934 via an input-output data bus 940. Write data are provided to the memory array 902 through the I/O data block 934 and the memory array read/write circuitry 930. the I/O data block 934 may include clocked circuitry that operate responsive to an internal clock signal DLL2DQOUT and an internal command signal QED2DQOUT, for example.

The memory 900 further includes clock path 912 and command path 914. The clock path 912 receives a input clock signal CLK and propagates the internal clock signal DLL2DQOUT which is based at least in part on the CLK signal to the I/O data block 934. The command path 914 may be implemented using a command path according to an embodiment of the invention. The command path 914, which is shown in FIG. 9 as being included in the command decoder 906, but is not limited to such a configuration, provides the internal command signal QED2DQOUT to the I/O data block 934. The command decoder 906 responds to memory commands provided to the command bus 908 to perform various operations on the memory array 902. In particular, the command decoder 906 is used to provide internal control signals to read data from and write data to the memory array 902.

From the foregoing it will be appreciated that, although specific embodiments of the invention have been described herein for purposes of illustration, various modifications may be made without deviating from the spirit and scope of the invention. Accordingly, the invention is not limited except as by the appended claims.

What is claimed is:

1. A command path, comprising:
   a command receiver configured to receive a command;
   a command buffer coupled to the command receiver and configured to receive the command and provide a buffered command;
   a command block coupled to the command buffer to receive the buffered command, the command block configured to provide the buffered command responsive to a clock signal and further configured to add a delay to the buffered command, the delay based at least in part on a shift count;
   a timing calibration block coupled to the command block and configured to provide the shift count, the timing calibration block including a model delay path having a model path delay based at least in part on a command path delay and a data circuit path delay, wherein the shift count based at least in part on the modeled path delay; and
   a command tree coupled to the command block to receive the buffered command and configured to distribute the buffered command to a data block.

2. The command path of claim 1, wherein the shift count is based at least in part on a difference between latency value and the modeled path delay.

3. The command path of claim 1 wherein the timing calibration block comprises:
   a path delay measurement circuit configured to determine the modeled path delay through the model delay path and provide the shift count to the command block.

4. The command path of claim 3 wherein the command path delay models a command propagation delay from the command receiver through the command buffer block.

5. The command path of claim 3 wherein the path delay measurement is configured to determine the modeled path delay in a number of clock periods of the clock signal.

6. The command path of claim 3 wherein the path delay measurement circuit comprises:
   a plurality of logic blocks, each of the logic blocks configured to compare signals indicative of a latency value and indicative of the modeled path delay and determine a shift count therefrom.

7. The command path of claim 1 wherein the command buffer has a command buffer delay between receipt of the command and provision of the buffered command and wherein the command buffer comprises a command buffer and timing adjustment block that is further configured to adjust the command buffer delay of the command buffer based at least in part on the timing of a clock edge of the clock signal.

8. A clocked command path, comprising:
   a command receiver configured to receive a command;
   a command buffer coupled to the command receiver and configured to receive the command and provide a buffered command, the command buffer having a command buffer delay between receipt of the command and provision of the buffered command, the command buffer delay adjustable based at least in part on the timing of a clock edge of the clock signal;
   a command block coupled to the command buffer to receive the buffered command and configured to provide the buffered command responsive to a clock signal, the buffer command provided having a delay based at least in part on a shift count provided to the command block;

a timing calibration block configured to provide the shift count to the command block, the shift count based at least in part on a difference between a latency value and a path delay, wherein the path delay is modeled by a model path delay; and a command tree coupled to the command block to receive the buffered command and configured to distribute the buffered command to a data block.

9. The clocked command path of claim 8 wherein the command received by the command receiver comprises a read command.

10. The clocked command path of claim 8 wherein the command received by the command receiver comprises a on-die termination command.

11. The clocked command path of claim 8 wherein the command buffer comprises a command buffer and timing adjustment block, the command buffer and timing adjustment block configured to adjust the command buffer delay of the command buffer to substantially align a leading edge of the buffered command with a falling edge of the clock signal.

12. The clocked command path of claim 8 wherein the command buffer comprises a command buffer and timing adjustment block, the command buffer and timing adjustment block configured to adjust the command buffer delay of the command buffer to substantially align a center of the buffered command with a rising edge of the clock signal.

13. The clocked command path of claim 8 wherein the command buffer comprises a command buffer and timing adjustment block, the command buffer and timing adjustment block including:

a plurality of series coupled unit delays and comparators, each of the unit delays and comparators configured to receive the clock signal and detect a clock edge of the clock signal, each of the unit delays and comparators configured to delay the command by a unit delay.

14. The clocked command path of claim 13 wherein the unit delay and comparator detecting the clock edge of the clock signal is the last unit delay added to the command before being provided as the buffered command.

15. An apparatus, comprising:

a clock path distributing an internal clock signal based at least in part on an input clock signal;

a data block coupled to receive the internal clock signal and clock data responsive to the internal clock signal; and a command path coupled to the data block, the command path including:

a command receiver configured to receive a command;

a command buffer coupled to the command receiver and configured to receive the command and provide a buffered command;

a command block coupled to the command buffer to receive the buffered command the command block configured to provide the buffered command responsive to a clock signal and further configured to add a delay before to the buffered command, the delay based at least in part on a shift count;

a timing calibration block coupled to the command block and configured to provide the shift count, the shift count based at least in part on a modeled path delay provided by a model delay path included in the timing calibration block; and a command tree coupled to the command block to receive the buffered command and configured to distribute the buffered command to the data block.

16. A method for providing a command to a data block, the method comprising:

receiving a command;

propagating the command through a command path;

modeling a path delay of the command path;

determining a difference between a latency value and a command path delay of the command path by calculating a shift count based at least in part on a number of clock periods of delay through the modeled path delay and indicative of the difference between the latency value and the modeled path delay;

delaying the output of the command to a data block by a delay based at least in part on the difference; and providing the command to the output block responsive to a clock signal.

17. The method of claim 16 wherein modeling a path delay comprises:

modeling the path delay through a model delay path including model delays representing propagation delays through a data block and command path.

18. The method of claim 16, further comprising:

adding delay to the command path delay based at least in part on a clock edge of the clock signal.

19. The method of claim 18 wherein adding delay to the command path delay comprises:

adding delay to the command path delay to substantially align a leading edge of the command with a falling edge of the clock signal.

20. The method of claim 16 wherein receiving the command comprises:

receiving a read command.

21. The method of claim 16 wherein receiving the command comprises:

receiving an on-die termination command.

22. The method of claim 16 wherein delaying the output of the command to a data block comprises:

delaying the output of the command to the data block by a delay substantially equal to a whole number count of a clock period of the clock signal.

23. A command path, comprising:

a command receiver configured to receive a command;

command latch coupled to the command receiver and configured to latch the command and provide the same responsive to a latch clock;

a command buffer coupled to the command receiver and configured to receive the command and provide a buffered command;

an additive latency shift circuit coupled to the command latch and configured to provide the command to the command buffer and timing adjustment block responsive to a shifter clock signal;

a command block coupled to the command buffer to receive the buffered command, the command block configured to provide the buffered command responsive to a clock signal and further configured to add a delay to the buffered command, the delay based at least in part on a shift count; and a command tree coupled to the command block to receive the buffered command and configured to distribute the buffeted command to a data block.

24. A method for providing a command to a data block, the method comprising:

receiving, a command;

propagating the command through a command path, the command path including a command receiver, a command latch coupled to the command receiver, an additive latency shifter coupled to the command latch, and a command buffer and timing adjustment block coupled to the additive latency shifter;

determining a difference between a latency value and a command path delay of the command path;

delaying the output of the command to a data block by a delay based at least in part on the difference; and determining the command to the output block responsive to a clock signal.

* * * * *